United States Patent
Kuroda et al.

(10) Patent No.: US 7,304,324 B2
(45) Date of Patent: Dec. 4, 2007

(54) SEMICONDUCTOR MEMORY ELEMENT AND LIFETIME OPERATION STARTING APPARATUS THEREFOR

(75) Inventors: Kazuo Kuroda, Saitama (JP); Shuuichi Yanagisawa, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 11/639,333

(22) Filed: Dec. 15, 2006

(65) Prior Publication Data

US 2007/0252143 A1 Nov. 1, 2007

Related U.S. Application Data

(62) Division of application No. 10/516,336, filed as application No. PCT/JP03/06209 on May 19, 2003, now Pat. No. 7,220,987.

(30) Foreign Application Priority Data

May 31, 2002 (JP) ............................. 2002-160769

(51) Int. Cl.
*H01L 29/08* (2006.01)
(52) U.S. Cl. ........................... 257/48; 257/40; 257/922
(58) Field of Classification Search ............... 257/40, 257/922, 48; 438/82
See application file for complete search history.

(56) References Cited

FOREIGN PATENT DOCUMENTS

| JP | 61-115297 | 6/1986 |
|---|---|---|
| JP | 5-159592 | 6/1993 |
| JP | 10-222426 | 8/1998 |

OTHER PUBLICATIONS

International Search Report, dated Sep. 2003.

*Primary Examiner*—Sara Crane
(74) *Attorney, Agent, or Firm*—Nixon & Vanderhye, PC

(57) ABSTRACT

An example memory includes an address control portion, a protection film, a property deterioration material layer, data storage areas, and bonding pads. The protection film protects an organic semiconductor layer of a semiconductor circuit and prevents intrusion of moisture or chemical molecules in the air, light, or the like, into the organic semiconductor layer. Deterioration of the organic semiconductor layer is started by breaking the protection film and using a specified means, thus starting operation of the lifetime period. The property deterioration material layer contains a material for deteriorating the property of the organic semiconductor and deterioration of the organic semiconductor layer is started, for example, by diffusing the material into the organic semiconductor layer.

3 Claims, 12 Drawing Sheets

HEATING, PRESSURIZING, LIGHT IRRADIATION

HEATING , PRESSURIZING , LIGHT IRRADIATION

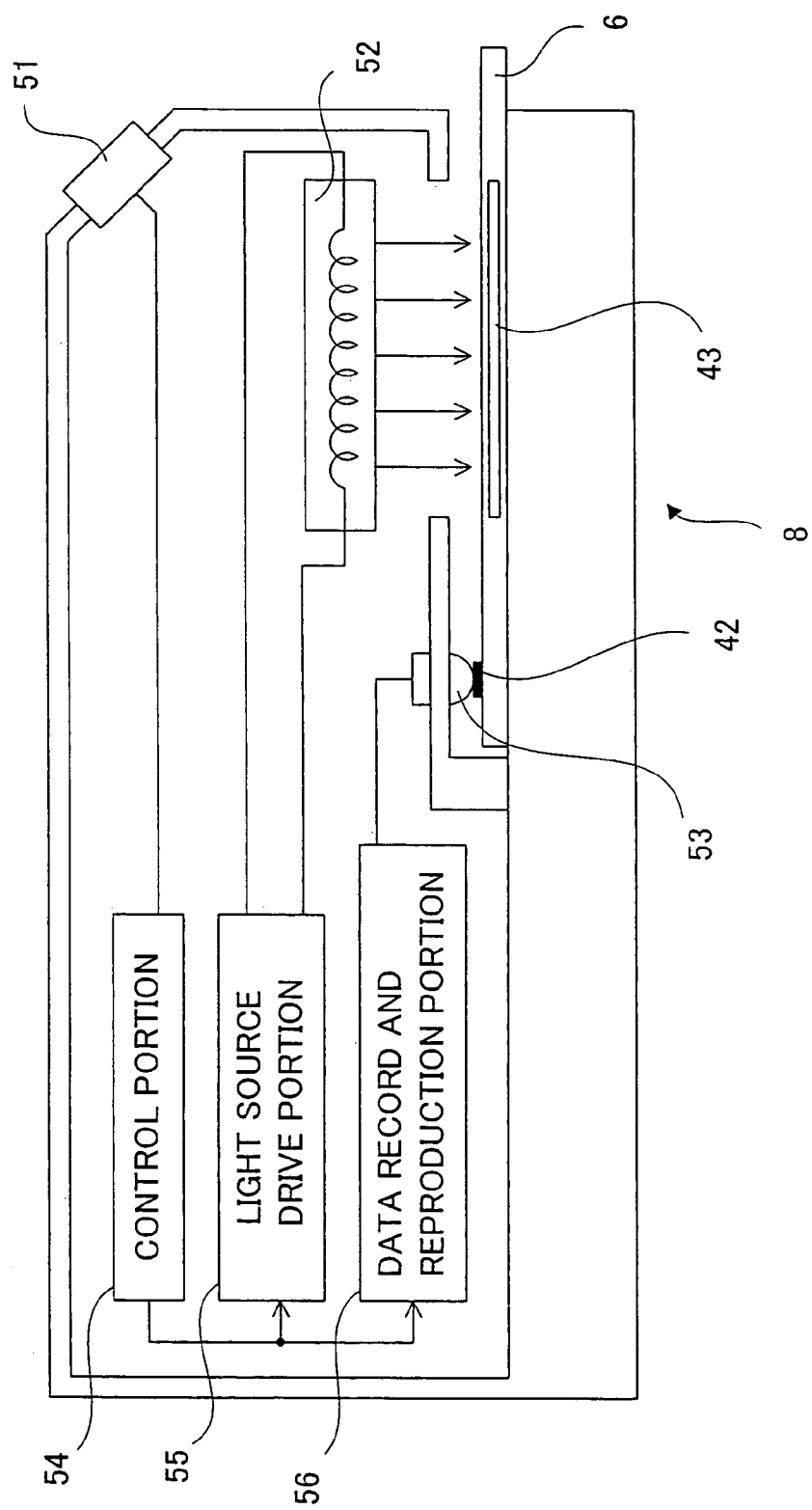

SEMICONDUCTOR MEMORY ELEMENT AND LIFETIME OPERATION STARTING APPARATUS THEREFOR

CROSS-REFERENCE TO RELATED APPLICATION

This application is a divisional of application Ser. No. 10/516,336, filed Apr. 13, 2005 now U.S. Pat. No. 7,220,987, which is the national stage of international Application No. PCT/JP03/06209 filed May 19, 2003, which designated the United States and claims the benefit of JP 2002-160769, filed May 31, 2002.

TECHNICAL FIELD

The present invention relates to a semiconductor memory element using an organic semiconductor having a predetermined lifetime for defining a retention time during which recorded data can be reproduced and capable of starting the lifetime at a predetermined time, and further relates to a lifetime operation starting apparatus therefor.

BACKGROUND ART

High density and high integration semiconductor devices have been manufactured and supplied, owing to a development of fine technology in a semiconductor manufacturing. Particularly in a semiconductor memory manufactured in a sub micron rule, a great number of memory elements are formed in one chip, which allows recording music and video for a long time, coupled with a lowered bit unit price and with a development in data compressing technology. Furthermore, employing an organic semiconductor element with a lower price may make the bit unit price lower.

In the semiconductor memory useful as a record medium, as well as in view of the cost, it is expected to prevent or block the data reading after a predetermined time elapse from the data recording, for example in an application for a commuter pass (ticket), or an application in a rental business of music or video soft and the like.

As the semiconductor memory compatible to such an expectation, Japanese Patent Application Laid-Open No. H10-189780 discloses an example of the technology. According to this, a gate insulation layer may be formed of a first layer of a silicon dioxide film, a second layer of a silicon nitride film and a third layer of a silicon dioxide film, in which a composition rate of Si atom and N atom in the second layer of the silicon nitride film is set to a value corresponding to a desired data effective time. Owing to this construction, the data effective time is expected to be set in such a manner that a shallow electric charge lap is positively formed to deteriorate the memory retention, and an amount of the electric charge to be accumulated in an electric charge accumulation mechanism is reduced and thereby the lifetime of the data retention is shortened. The lifetime of record data in this type of memory is determined by controlling the composition rate of Si atom and N atom in the silicon nitride during the chip fabrication.

DISCLOSURE OF INVENTION

However, in the aforementioned memory in which the lifetime of the record data is determined by controlling the composition rate of Si atom to N atom, the memory lifetime is adversely determined on the fabrication. The lifetime is based on the fabrication time, and it is difficult to know, on an actual data recording, an elapsed time from the fabrication. Therefore, it is not possible to know the effective time from the data recording, which is a problem in a practical use.

Therefore, it is an object of the present invention to provide a semiconductor memory element and a lifetime operation starting apparatus therefor suitable for a mass production with a lower cost, capable of setting the lifetime of the recorded data, i.e. the reproducible effective time and capable of desirably setting a start of the operation within the lifetime.

The first semiconductor memory element of the present invention in order to solve the above problems is a semiconductor memory element comprising: a substrate; a semiconductor circuit portion made of an organic semiconductor disposed on the substrate; and a protection portion disposed adjacent to the semiconductor circuit portion, the protection portion being made of a material capable of causing a crack extending to the semiconductor circuit portion due to a predetermined means.

According to the first semiconductor memory element of the present invention, the semiconductor circuit is made of the organic semiconductor, and the protection portion for protecting a layer forming the semiconductor circuit is disposed. The protection portion can make a crack reachable to the layer forming the semiconductor circuit by the predetermined means. From the crack, moisture or oxygen in the air penetrates into the semiconductor circuit portion and diffuses therein. The organic semiconductor is deteriorated in its performance by the moisture or oxygen. And the organic semiconductor fails to function after a certain time period. Therefore, it becomes impossible to reproduce the recorded data after a certain time period, and thereby the memory and the like having the predetermined lifetime (the "lifetime" in the present invention means a time period from a start time of the deterioration in the organic semiconductor by the performance deterioration material until the organic semiconductor loses the semiconductor function.) is formed. Furthermore, the lifetime can be set depending on the extent of cracks to be caused.

The second semiconductor memory element of the present invention in order to solve the above problems is a semiconductor memory element comprising: a substrate; a semiconductor circuit portion made of an organic semiconductor disposed on the substrate; a protection portion disposed adjacent to the semiconductor circuit portion and having a window portion; and a freely strippable seal member for sealing the window portion of the protection portion.

According to the second semiconductor memory element of the present invention, the semiconductor circuit is made of the organic semiconductor, and the protection portion for protecting a layer forming the semiconductor circuit is disposed. The protection portion has a window portion, which is sealed with the seal member. If the seal member is stripped off, moisture or oxygen in the air penetrates into the semiconductor circuit and diffuses therein. From then, the organic semiconductor is deteriorated in its performance by the moisture or oxygen. And the organic semiconductor fails to function after a certain time period. Therefore, the memory and the like having the predetermined lifetime are formed.

The third semiconductor memory element of the present invention in order to solve the above problems is a semiconductor memory element comprising: a substrate; a semiconductor circuit portion made of an organic semiconductor disposed on the substrate; a protection portion disposed adjacent to the semiconductor circuit portion; and a performance deterioration material layer including a performance deterioration material and disposed adjacent to the protection portion, the protection portion being made of a material capable of causing a crack extending to the semiconductor circuit portion due to a predetermined means.

According to the third semiconductor memory element of the present invention, the semiconductor circuit is made of the organic semiconductor, and the protection portion for protecting a layer forming the semiconductor circuit is disposed. Furthermore, the performance deterioration material layer including the performance deterioration material for deteriorating the organic semiconductor material is disposed above the protection portion. The protection portion can make a crack reachable to the layer forming the semiconductor circuit by the predetermined means. From the crack, the performance deterioration material in the performance deterioration material layer penetrates into the semiconductor circuit portion and diffuses therein. The organic semiconductor is deteriorated in its performance by the performance deterioration material. And the organic semiconductor fails to function after a certain time period. Therefore, the memory and the like having the predetermined lifetime to make the recorded data reproduction impossible after a certain time period is formed. Furthermore, the lifetime can be set depending on the extent of cracks to be caused.

In an aspect of the first or third semiconductor memory element of the present invention, the predetermined means is a mechanical punch means.

According to this aspect, a micro-hole/micro-holes is/are formed in the protection portion by a mechanical means such as a needle like means. The moisture or oxygen in the air, or the performance deterioration material in the performance deterioration material layer can penetrate into the semiconductor circuit portion and diffuse therein.

In another aspect of the first or third semiconductor memory element of the present invention, the predetermined means is a heating means.

According to this aspect, the crack is caused by heating the protection portion. The moisture or oxygen in the air, or the performance deterioration material in the performance deterioration material layer can penetrate into the semiconductor circuit portion and diffuse therein.

In another aspect of the first or third semiconductor memory element of the present invention, the predetermined means is a pressurizing means.

According to this aspect, the crack is caused by pressurizing the protection portion. The moisture or oxygen in the air, or the performance deterioration material in the performance deterioration material layer can penetrate into the semiconductor circuit portion and diffuse therein.

In another aspect of the semiconductor memory element of the present invention, the predetermined means is a light irradiation means.

According to this aspect, the crack is caused by irradiating light of a predetermined wavelength to the protection portion. The moisture or oxygen in the air, or the performance deterioration material in the performance deterioration material layer can penetrate into the semiconductor circuit portion and diffuse therein.

The fourth semiconductor memory element of the present invention in order to solve the above problems is a semiconductor memory element comprising: a substrate; a semiconductor circuit portion disposed on the substrate and made of an organic semiconductor including a performance deterioration material; and a protection portion disposed adjacent to the semiconductor circuit portion, wherein the performance deterioration material is activated by a predetermined means.

According to the fourth semiconductor memory element of the present invention, the semiconductor circuit is made of the organic semiconductor, and the protection portion for protecting a layer forming the semiconductor circuit is disposed. The performance deterioration material for deteriorating the organic semiconductor performance is dispersed in the semiconductor circuit portion. The deterioration material is activated by releasing the trigger ("releasing the trigger" in the present application means to start the activation of the performance deterioration material), which causes the deterioration of the organic semiconductor. And the organic semiconductor fails to function after a certain time period. Therefore, the memory and the like having the predetermined lifetime to make the recorded data reproduction impossible after a certain time period is formed. Furthermore, the lifetime can be set depending on the extent of the performance deterioration material dispersion or the extent of the activation.

The fifth semiconductor memory element of the present invention in order to solve the above problems is a semiconductor memory element comprising: a substrate; a semiconductor circuit portion disposed on the substrate and made of an organic semiconductor including a performance deterioration material; and a film disposed adjacent to the semiconductor circuit portion, capable of obtaining light transmissive property due to an irradiation of light having a predetermined wavelength thereon, wherein the performance deterioration material is activated by a predetermined means.

According to the fifth semiconductor memory element of the present invention, the semiconductor circuit is made of the organic semiconductor, and the color film layer is disposed above a layer forming the semiconductor circuit to cover and protect the latter. The performance deterioration material for deteriorating the organic semiconductor is dispersed in the semiconductor circuit portion. The color film obtains light transmissive property by irradiating the light of the predetermined wavelength. Then, the performance deterioration material is activated by the released trigger, and thereby the organic semiconductor is deteriorated and the organic semiconductor fails to function after a certain time period. Therefore, the memory and the like having the predetermined lifetime to make the recorded data reproduction impossible after a certain time period is formed. Furthermore, the lifetime can be set depending on the extent of the performance deterioration material dispersion or the extent of the activation.

The sixth semiconductor memory element of the present invention in order to solve the above problems is a semiconductor memory element comprising: a substrate; a semiconductor circuit portion disposed on the substrate and made of an organic semiconductor including a performance deterioration material; a protection portion disposed adjacent to the semiconductor circuit portion and having a window portion; and a freely strippable seal member for sealing the window portion of the protection portion.

According to the sixth semiconductor memory element of the present invention, the semiconductor circuit is made of the organic semiconductor, and the protection portion is disposed above a layer forming the semiconductor circuit. The performance deterioration material for deteriorating the organic semiconductor is dispersed in the semiconductor circuit portion. The protection portion is provided with the window portion at a position corresponding to the semiconductor circuit. The window portion is sealed with the seal member. If the seal member is stripped off to release the trigger for activating the performance deterioration material dispersed in the semiconductor circuit portion by the predetermined means, the organic semiconductor is deteriorated. And the organic semiconductor fails to function after a certain time period. Therefore, the memory and the like having the predetermined lifetime to make the recorded data reproduction impossible after a certain time period is formed. Furthermore, the lifetime can be set depending on the extent of the performance deterioration material dispersion or the extent of the activation.

In an aspect of the semiconductor memory element of the present invention, the performance deterioration material is encapsulated.

According to this aspect, some performance deterioration materials begin to deteriorate from the beginning of the dispersion. However, if these performance deterioration materials are encapsulated and the capsule is broken on the time to begin the deterioration, the organic semiconductor starts to deteriorate.

In another aspect of the semiconductor memory element of the present invention, the predetermined means is a pressurizing means.

According to this aspect, the performance deterioration material dispersed in the semiconductor circuit portion made of the organic semiconductor is activated by pressurizing.

In another aspect of the semiconductor memory element of the present invention, the predetermined means is a heating means.

According to this aspect, the performance deterioration material dispersed in the semiconductor circuit portion made of the organic semiconductor is activated by heating.

In another aspect of the semiconductor memory element of the present invention, the predetermined means is an UV irradiation means.

According to this aspect, the performance deterioration material dispersed in the semiconductor circuit portion made of the organic semiconductor is activated by irradiating UV (ultraviolet) rays.

In another aspect of the semiconductor memory element of the present invention, the predetermined means is an electron beam irradiation means.

According to this aspect, the performance deterioration material dispersed in the semiconductor circuit portion made of the organic semiconductor is activated by irradiating electron beam.

In another aspect of the semiconductor memory element of the present invention, the deterioration in the semiconductor circuit portion of the organic semiconductor is started by stripping off the seal member.

According to this aspect, in the case that the protection portion provided with the window portion corresponding to a predetermined circuit position of the semiconductor circuit portion is provided, if the seal member sealing the window portion is stripped off, the organic semiconductor starts to deteriorate.

In another aspect of the semiconductor memory element of the present invention, the semiconductor portion is a semiconductor portion in a range corresponding to a predetermined circuit portion of the semiconductor circuit portion.

According to this aspect, in the semiconductor circuit portion to be deteriorated, the organic semiconductor can be deteriorated relative to an arbitrary part. Therefore, there is no need of the configuration to deteriorate the organic semiconductor relative to the entire circuit.

In another aspect of the semiconductor memory element of the present invention, the predetermined circuit portion is a data area.

According to this aspect, the lifetime is determined by deteriorating the data area of the semiconductor circuit.

In another aspect of the semiconductor memory element of the present invention, the predetermined circuit portion is a management information area.

According to this aspect, the lifetime is determined by deteriorating the management information area of the semiconductor circuit.

In another aspect of the semiconductor memory element of the present invention, the predetermined circuit portion is an electric power shutdown switch.

According to this aspect, the lifetime is determined by deteriorating the electric power source shut down switch of the semiconductor circuit.

In another aspect of the semiconductor memory element of the present invention, the predetermined circuit portion is an encryption key record area.

According to this aspect, the lifetime is determined by deteriorating the encryption key record area of the semiconductor circuit.

The first lifetime operation starting apparatus for the semiconductor memory element of the present invention in order to solve the above problems is a lifetime operation starting apparatus having an starting device for starting an operation of a semiconductor memory element using an organic semiconductor within a lifetime, comprising a seal strip off device for stripping off a seal attached to a position corresponding to a predetermined portion of the organic semiconductor in order to deteriorate a performance of the organic semiconductor as the starting device.

According to the first lifetime operation starting apparatus for the semiconductor memory element of the present invention, in the case that the protection portion covering the organic semiconductor is provided with the window portion, which is sealed with the seal member, the trigger to start the lifetime is stripping off the seal member. Therefore, the lifetime operation starting apparatus is provided with the seal strip off device for stripping off the seal member. A mechanism may be additionally employed in order to strip off the seal automatically, when the semiconductor memory element is mounted onto the record apparatus for the data recording.

The second lifetime operation starting apparatus for the semiconductor memory element of the present invention, a lifetime operation starting apparatus having an starting device for starting an operation of a semiconductor memory element using an organic semiconductor within a lifetime, comprising, in order to cause a crack in a protection portion protecting the organic semiconductor as the starting device, at least one of a mechanical punch device for punching a microhole through the protection portion; a heating device for heating the protection portion; a pressurizing device for pressurizing the protection portion; and a light irradiation device for irradiating the protection portion with light.

According to the second lifetime operation starting apparatus for the semiconductor memory element of the present invention, there is provided with any one or a plurality of a mechanism for mechanically forming a micro-hole/microholes, a mechanism for causing the crack by heating, a mechanism for causing the crack by pressurizing and a mechanism for causing the crack by irradiation with light, as a device for causing the crack in the protection portion protecting the organic semiconductor and releasing the trigger to the deterioration of the organic semiconductor. It may be employed depending on the formation of the protection portion and the formation of the performance deterioration material. Alternatively, the deterioration speed of the organic semiconductor can be controlled to determine the lifetime by employing a mechanism for controlling the operation time. Furthermore, these mechanisms can be additionally disposed at the record apparatus for the semiconductor memory element, in order to release the trigger on the data recording.

The third lifetime operation starting apparatus for the semiconductor memory element of the present invention in order to solve the above problems is a lifetime operation starting apparatus having an starting device for starting an operation of a semiconductor memory element using an organic semiconductor within a lifetime, comprising, in order to activate a performance deterioration material dispersed in the organic semiconductor as the starting device, at least one of: a UV irradiation device for irradiating the performance deterioration material in the organic semiconductor with UV rays; and an electron beam irradiation device for irradiating the performance deterioration material in the organic semiconductor with electron beam.

According to the third lifetime operation starting apparatus for the semiconductor memory element of the present invention, there is provided with any one or a plurality of a mechanism for irradiating the UV rays to the performance deterioration material and a mechanism for irradiating the electron beam to the performance deterioration material, in order to activate the performance deterioration material dispersed in the organic semiconductor. It may be employed depending on the formation of the protection portion and the formation of the performance deterioration material. Furthermore, the deterioration speed of the organic semiconductor can be controlled to determine the lifetime by employing a mechanism for controlling the operation time. Furthermore, these mechanisms can be additionally disposed at the record apparatus for the semiconductor memory element to release the trigger on the data recording.

These effects and other advantages of the present invention will be apparent from the following explanation.

BRIEF DESCRIPTION OF DRAWINGS

FIG. 16 is a view illustrating an exemplary construction of the lifetime operation starting apparatus for the card like semiconductor memory element of the present invention.

BEST MODE FOR CARRYING OUT THE INVENTION

The semiconductor memory element according to the present invention is a memory using the organic semiconductor to construct the circuit, allowing the recorded data reading for a certain time period (referred to as the "lifetime" herein as appropriate) during which the memory function is maintained, although the deterioration trigger is released, owing to the organic semiconductor characteristic property, for example the property of the deterioration because of chemical reactions with the moisture or oxygen, or the predetermined chemicals. The lifetime of the memory can be activated at any time, and the lifetime length can be set depending on the conditions.

Thus, it is a memory capable of setting the reproducible time length of the recorded data and making the data reproduction impossible after the elapse of the set time length, for example suitable for a commuter pass (ticket) with the expiration date fixed, the rental business of the music or video soft and so on. Furthermore, since the organic material is employed, the element can be in a large size by using a printing technology, and the cost is small.

Incidentally, the form to make the data reproduction impossible is not limited to delete the recorded data itself, but includes breaking the management information or the encryption key to make a state that the recorded data cannot be reproduced.

Figure 1:
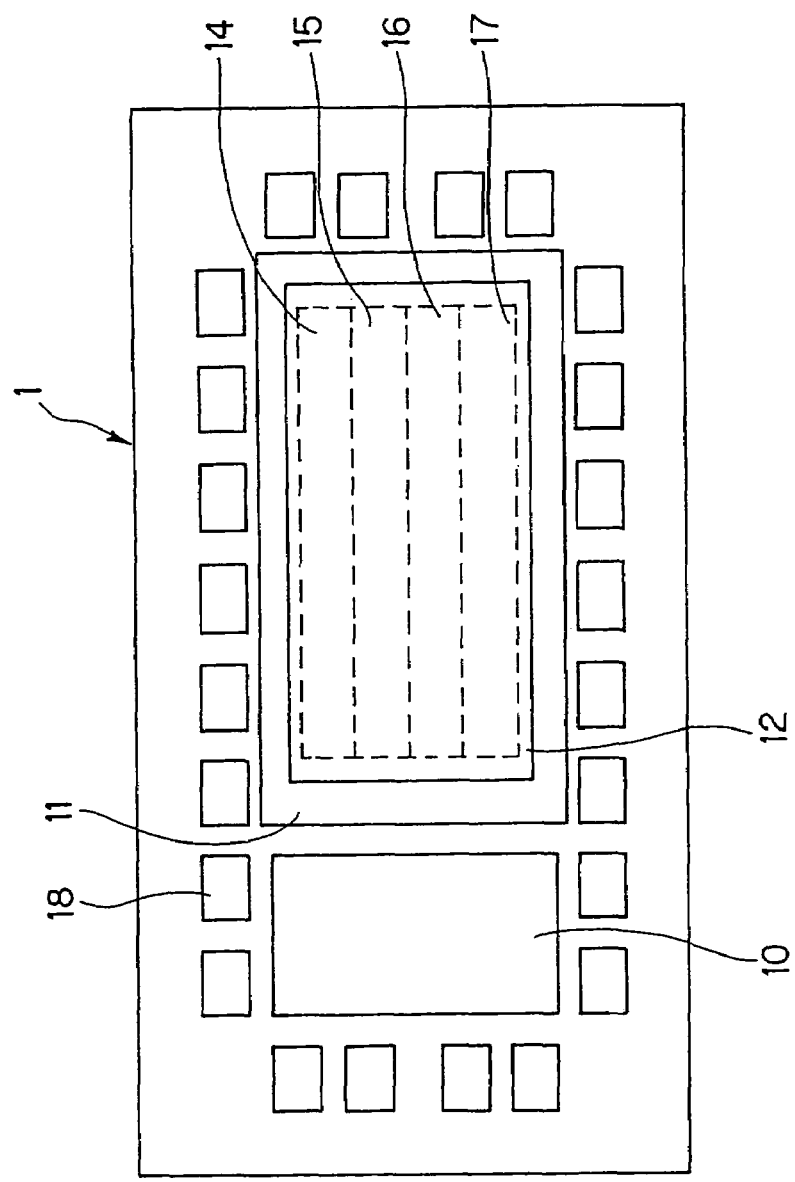
FIG. 1 is a general view illustrating a construction of the semiconductor memory element of the present invention.
Figure 2:
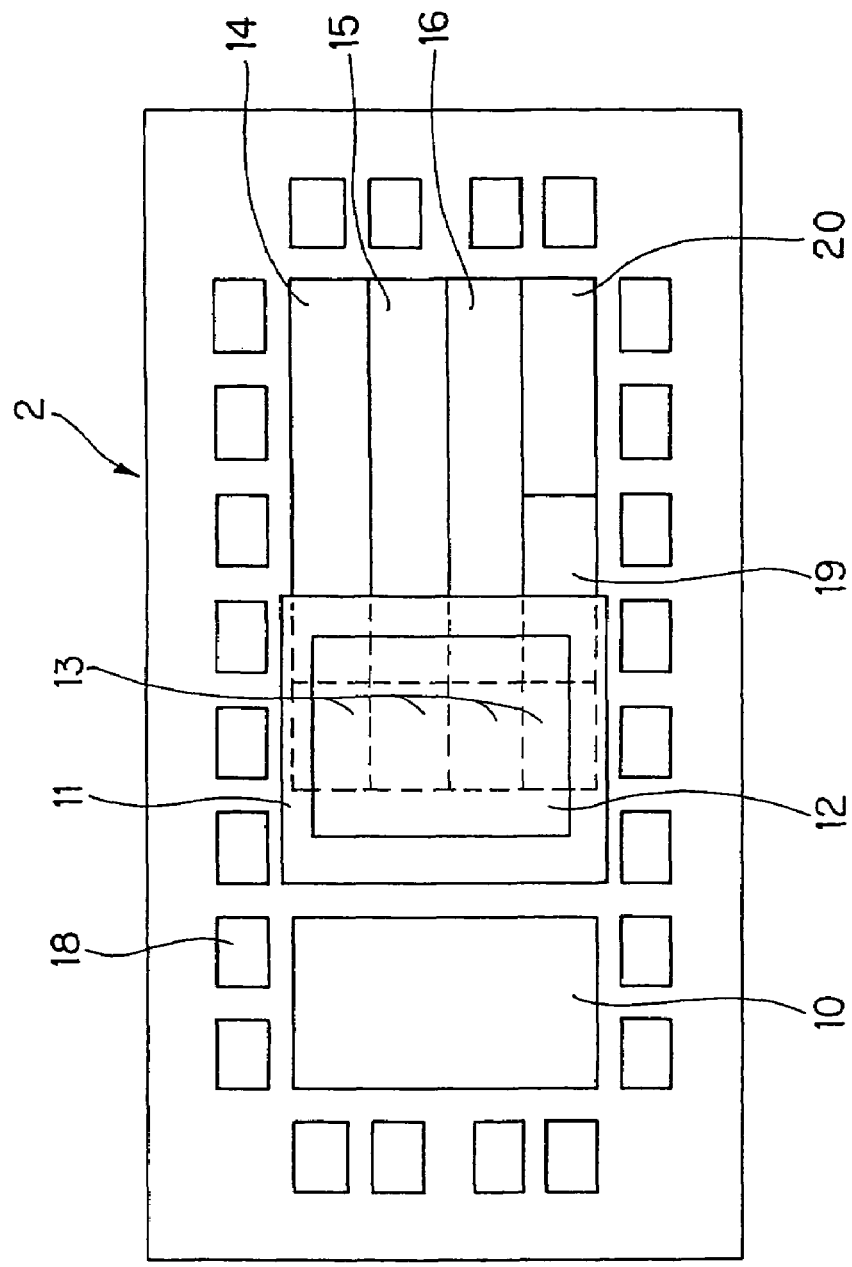
FIG. 2 is a general view illustrating another construction of the semiconductor memory element of the present invention.
Figure 3:
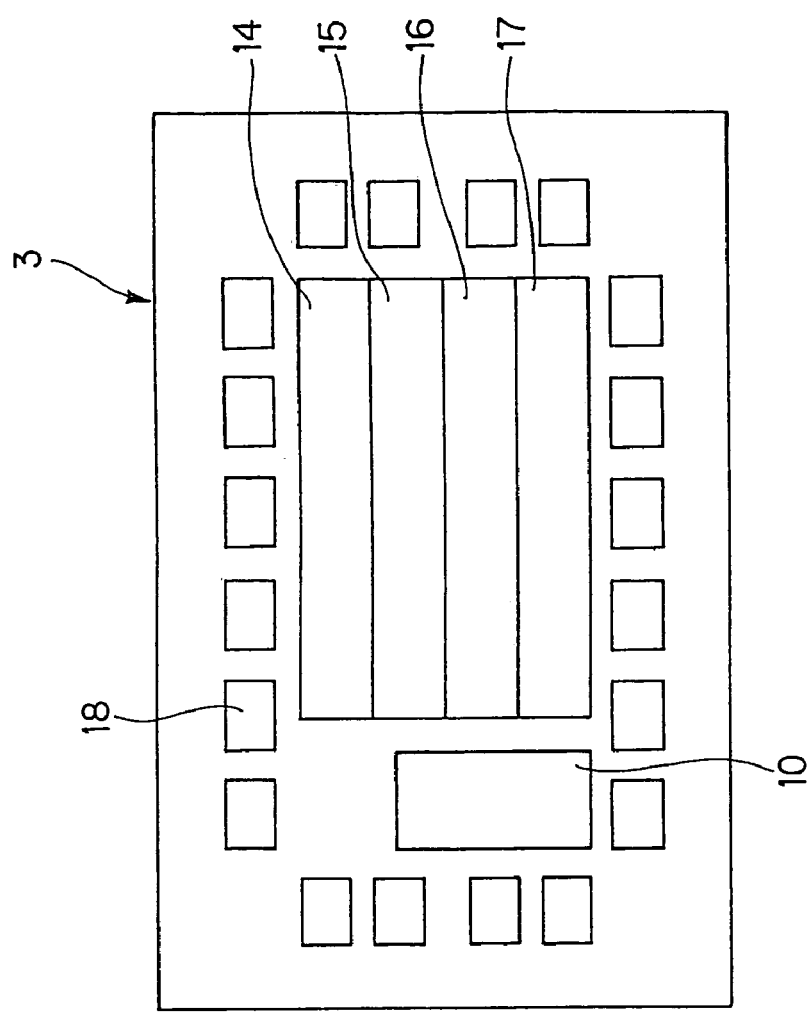
FIG. 3 is a general view illustrating a conventional semiconductor memory element.
Figure 4:
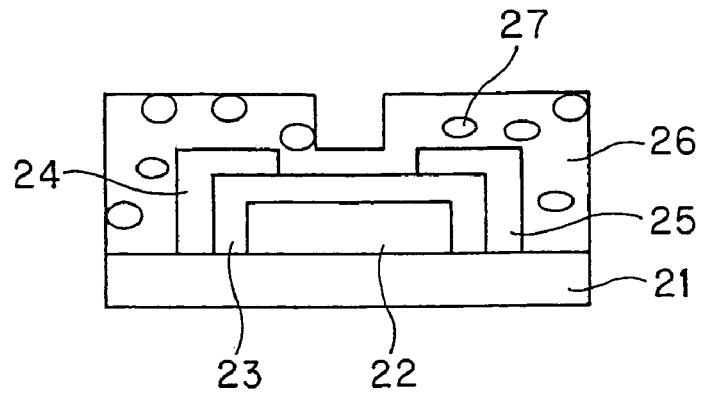
FIG. 4 is a view illustrating the first element construction of the semiconductor memory element of the present invention.
Figure 5:
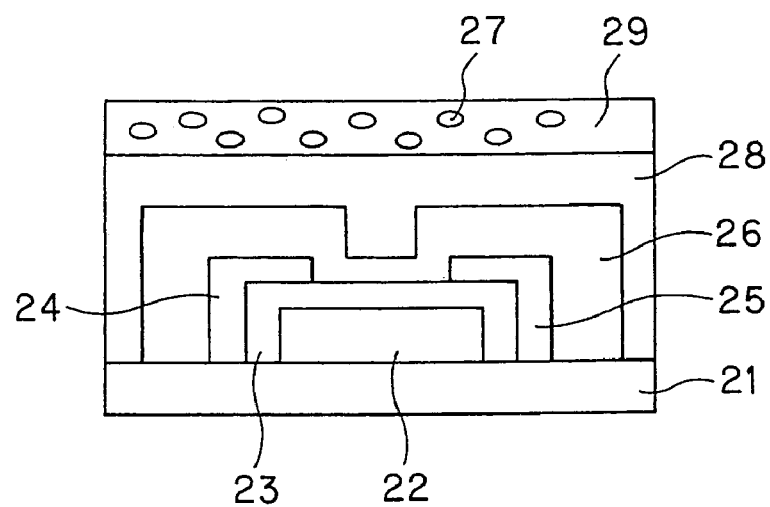
FIG. 5 is a view illustrating the second element construction of the semiconductor memory element of the present invention.
Figure 6:
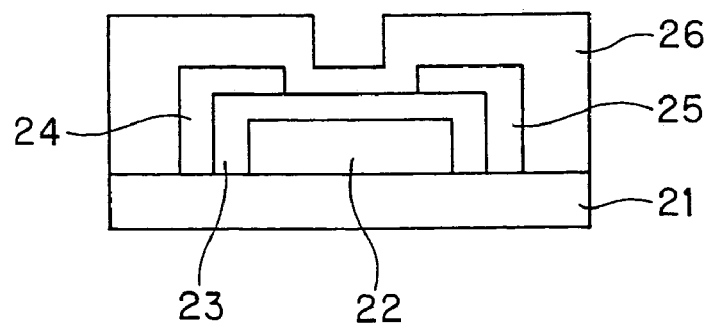
FIG. 6 is a view illustrating an element construction of the conventional semiconductor memory element.

First, the construction of the semiconductor memory element of the present invention will be explained, with reference to FIG. 1 to FIG. 6. FIG. 1 illustrates an outline of a semiconductor memory element construction according to the present invention. FIG. 2 illustrates an outline of another semiconductor memory element construction according to the present invention. FIG. 3 illustrates an outline of a conventional semiconductor memory element for a comparison. Furthermore, FIG. 4 illustrates the first element configuration of the semiconductor memory element according to the present invention, and FIG. 5 illustrates the second element configuration. FIG. 6 illustrates a conventional element configuration for a comparison.

The memory 1 of the semiconductor memory element according to the present invention, as shown in FIG. 1, is provided with an address control portion 10; a protection film 11; a performance deterioration material layer 12; data storage areas 14, 15, 16, 17; and a bonding pad 18.

The address control portion 10 designates storage positions in the data storage areas 14, 15, 16 and 17, on the basis of the addresses of rows and columns inputted from the external terminal.

The protection film 11 is formed to protect the organic semiconductor layer constructing the semiconductor circuit, and prevents the moisture in the air, the chemicals, the light or the like from penetrating into the organic semiconductor layer. On the other hand, if this protection film 11 is destroyed and the predetermined means are performed, the organic semiconductor layer starts to deteriorate and enters the lifetime length operation.

The performance deterioration material layer 12 includes the material for deteriorating the organic semiconductor performance. If this material diffuses within the organic semiconductor layer, the organic semiconductor layer is deteriorated to determine the lifetime. Before the diffusion, the protection film 11 prevents the material from contacting with the organic semiconductor layer. As mentioned above, if this protection film 11 is destroyed, the performance deterioration material diffuses within the organic semiconductor layer.

Incidentally, a method or configuration for deteriorating the organic semiconductor layer is not limited to this example, and various forms will be explained in detail later.

The data storage areas 14, 15, 16 and 17 are areas for storing data. The data effective time can be set for each area. It will be obvious to those skilled in the art that the data storage areas may be a united single area, or may be further divided into more areas. Furthermore, the protection film 11 may be disposed separately and individually for each data storage area. Thereby, it is possible to set individual lifetimes for each data storage area.

The bonding pad 18 is a connecting terminal for establishing an electrical connection with the external circuit. There are provided with terminals corresponding to an electric power source, a data I/O (input/output), a data address, a record reproduction signal and other control signals of the memory 1.

Next, the memory 2 of the semiconductor memory element according to the present invention, as shown in FIG. 2, is provided with an address control portion 10; a protection film 11; a performance deterioration material layer 12; a power supply switch 13; data storage areas 14, 15, 16; a bonding pad 18; an encryption key storage area 19; and an encryption circuit 20.

Here, the constructions and operations of the address control portion 10, the protection film 11, the performance deterioration material layer 12, the data storage areas 14, 15, 16 and the bonding pad 18 are the same as those of the aforementioned memory 1, and thus the same explanation is not repeated.

The memory 2 is provided with the device for encrypting the data to be recorded, the device for storing the encryption key, and the switch for controlling the power supply respectively to each data storage area and the encryption key storage area. The data reproduction operation within the lifetime can be set by deteriorating the organic semiconductor forming the encryption key storage area 19 and the power supply switch 13.

The power supply switch 13 may be individually provided for each data storage area 14, 15 or 16, and the encryption key storage area 19. The protection film 11 is provided above these power supply switches 13, and the performance deterioration material layer 12 is further provided adjacent to the protection film 11. If the protection film 11 above the power supply switch 13 corresponding to a desired area is destroyed, the performance deterioration material in the performance deterioration material layer 12 diffuses within the organic semiconductor forming the desired power supply switch 13, so that the operation of the power supply switch 13 ends with the predetermined lifetime. As the result, the data in the area corresponding to the power supply switch 13 becomes impossible to be read. In the case of a volatile memory, the data is also deleted.

The encryption key storage area 19 is an area for storing the encryption key to encrypt the data to be recorded. The encryption key is used also in the case of decoding the encrypted data. As well as the data security is archived, in the case that the data effective time elapses to make the data reproduction impossible, deleting the encryption key makes the decoding impossible which thereby makes the data reproduction impossible.

The encryption circuit 20 is a circuit for encrypting the data to be recorded on the basis of the encryption key. Furthermore, it may include a circuit for decoding the data for the reproduction, or may read the encrypted data and the encryption key and perform the decoding at the external device such as a personal computer.

Incidentally, instead of disposing the performance deterioration material layer 12 in the memory 1 or 2, the performance deterioration material may be dispersed within the organic semiconductor to activate the performance deterioration material by the predetermined method.

FIG. 3 illustrates the construction of the conventional memory 3 for a comparison with the memories 1 and 2 of the present invention. There is not provided with the protection film 11 and the performance deterioration material layer 12. There is no technical concept about the memory lifetime, i.e. the reproduction effective time of the recorded data.

Next, the structure of the organic semiconductor element forming the semiconductor memory element according to the present invention will be explained.

First, FIG. 4 illustrates the first element structure in which a gate 22, an insulator 23, a source 24 and a drain 25 area disposed on a substrate 21. A semiconductor layer of an organic semiconductor 26 is further disposed outside of a gate 22, an insulator 23, a source 24 and a drain 25. A performance deterioration material 27 is dispersed within the organic semiconductor 26. Some performance deterioration materials 27 are directly dispersed and other performance deterioration materials 27 are encapsulated to be dispersed, depending on the activation form of the performance deterioration material. If the performance deterioration material 27 activates within the organic semiconductor 26, the organic semiconductor 26 starts to deteriorate. And it fails to function as a memory after a predetermined time period.

Next, the second element structure includes, as shown in FIG. 5, the gate 22, the insulator 23, the source 24 and the drain 25 on the substrate 21, and further includes the semiconductor layer of the organic semiconductor 26 outside of gate 22, the insulator 23, the source 24 and the drain 25. Furthermore, the second element structure includes a protection portion 28 outside of the organic semiconductor 26 on the substrate, and a performance deterioration material layer 29 above the protection portion 28. The performance deterioration material layer 29 includes therein the performance deterioration material 27. If the protection portion 28 is destroyed, the performance deterioration material 27 diffuses within the organic semiconductor 26, so that the organic semiconductor 26 starts to deteriorate until it fails to function as a memory after a predetermined time period.

FIG. 6 illustrates the conventional element structure in which the gate 22, the insulator 23, the source 24 and the drain 25 are disposed on the substrate 21, and the organic semiconductor 26 is disposed outside of the gate 22, the insulator 23, the source 24 and the drain 25. It is known that the organic semiconductor 26 is deteriorated by the moisture or oxygen. Therefore, this conventional structure, as it is, can be covered by the protection film or the like to prevent the organic semiconductor 26 from contacting with the air. Then, the protection film can be destroyed to cause the operation within the lifetime. Particularly, the conventional element structure can be directly used, without a special treatment of the element structure itself.

FIRST EXAMPLE OF SEMICONDUCTOR MEMORY ELEMENT ACCORDING TO THE PRESENT INVENTION

Figure 7A:
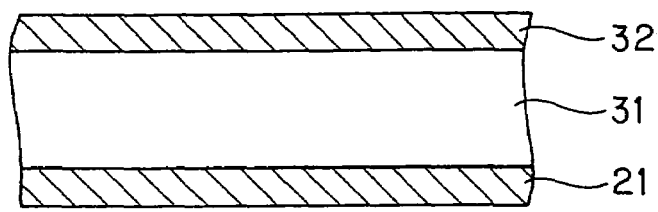
FIG. 7(A) and FIG. 7.(B) are views illustrating the first example of the semiconductor memory element according to the present invention.
Figure 7B:
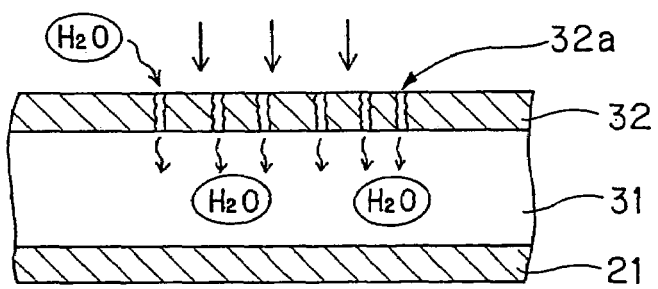

In this example, as shown in FIG. 7A, an organic semiconductor circuit portion 31 and a protection film 32 adjacent to the circuit portion 31 are disposed on the substrate 21. As shown in FIG. 7B, heat, pressure, light or the like is applied or irradiated on the protection film 32 to make cracks 32a in the protection film 32. Through this cracks 32a, the moisture or oxygen in the air penetrates into the organic semiconductor circuit portion 31 and diffuses therein, which deteriorates the function of the organic semiconductor circuit portion 31. Because the deterioration in the function of the organic semiconductor circuit portion 31 progresses, the reproduction of the recorded data becomes impossible after a predetermined time period.

SECOND EXAMPLE OF SEMICONDUCTOR MEMORY ELEMENT ACCORDING TO THE PRESENT INVENTION

Figure 8A:
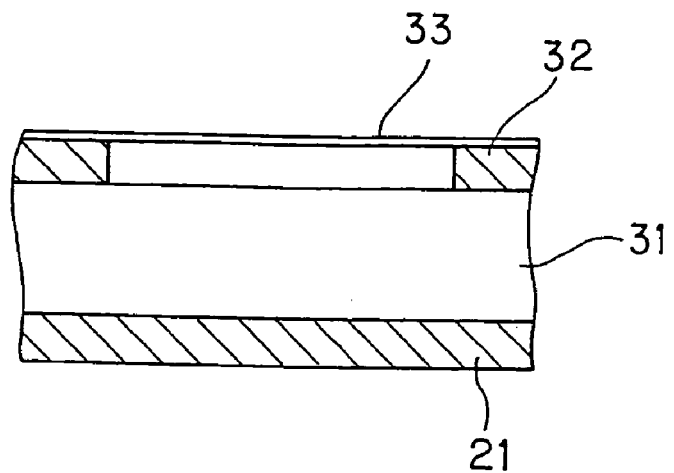
FIG. 8(A) and FIG. 8.(B) are views illustrating the second example of the semiconductor memory element according to the present invention.
Figure 8B:
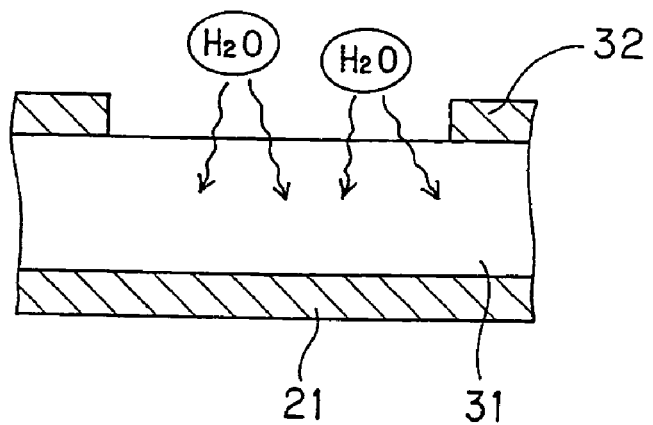

In this example, as shown in FIG. 8, the organic semiconductor circuit portion 31 and the protection film 32 adjacent to the circuit portion 31 are disposed on the substrate 21. The protection film 32 has an opening portion at a predetermined portion of the organic semiconductor circuit portion 31. A seal 33 is hermetically disposed above the opening portion. As shown in FIG. 8B, if the seal 33 is stripped off, the moisture or oxygen in the air penetrates into the organic semiconductor circuit portion 31 and diffuses therein to cause the deterioration in the function of the organic semiconductor circuit portion 31. Because the deterioration in the function of the organic semiconductor circuit portion 31 progresses, the data reproduction becomes impossible after a predetermined time period.

THIRD EXAMPLE OF SEMICONDUCTOR MEMORY ELEMENT ACCORDING TO THE PRESENT INVENTION

Figure 9A:
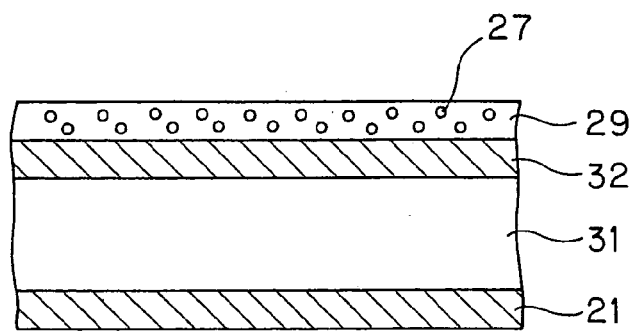
FIG. 9(A) and FIG. 9.(B) are views illustrating the third example of the semiconductor memory element according to the present invention.
Figure 9B:
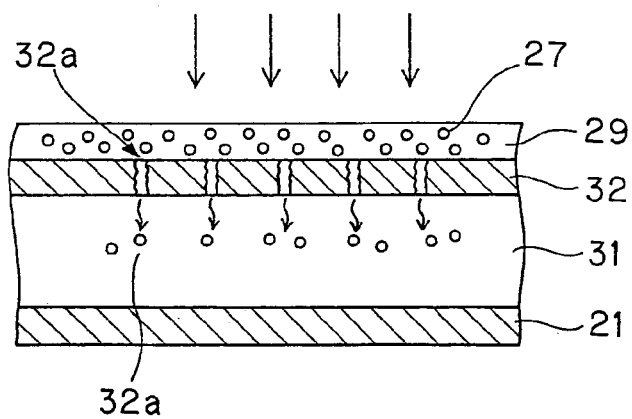

In this example, as shown in FIG. 9A, the organic semiconductor circuit portion 31, the protection film 32 adjacent to the circuit portion 31 and the performance deterioration material layer 29 including the performance deterioration material 27 and adjacent to the protection film 32 are disposed on the substrate 21. As shown in FIG. 9B, heat, pressure, light or the like is applied or irradiated on the protection film 32 to make cracks 32a in the protection film 32. Through this cracks 32a, the performance deterioration material 27 in the performance deterioration material layer 29 penetrates into the organic semiconductor circuit portion 31 and diffuses therein to cause the deterioration in the function of the organic semiconductor circuit portion 31. Because the deterioration in the function of the organic semiconductor circuit portion 31 progresses, the reproduction of the recorded data becomes impossible after a predetermined time period.

FOURTH EXAMPLE OF SEMICONDUCTOR MEMORY ELEMENT ACCORDING TO THE PRESENT INVENTION

Figure 10A:
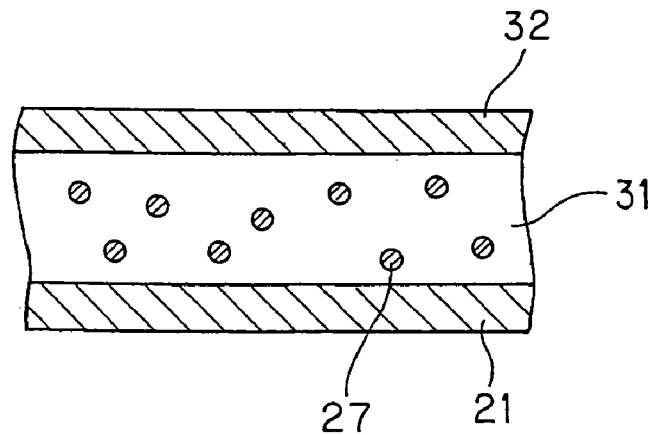
FIGS. 10(A)-10(C) are views illustrating the fourth example of the semiconductor memory element according to the present invention.
Figure 10B:
Figure 10B:
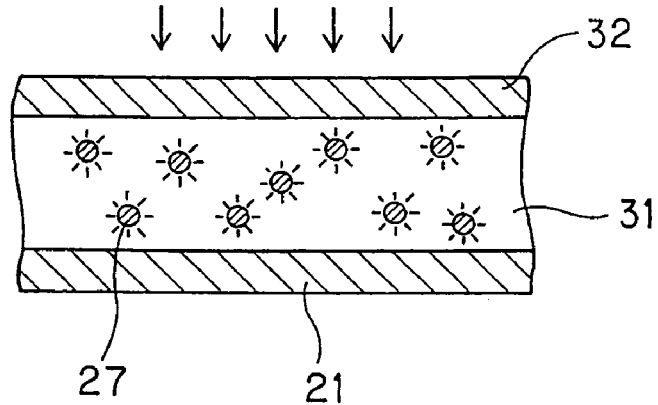

In this example, as shown in FIG. 10A, the organic semiconductor circuit portion 31 and the protection film 32 adjacent to the circuit portion 31 are disposed on the substrate 21. Furthermore, the performance deterioration material 27 is dispersed in the organic semiconductor circuit portion 31. As shown in FIG. 10B, if the performance deterioration material 27 is activated by heating, pressurizing, irradiation with light, and the like, from the top of the protection film 32, the function of the organic semiconductor circuit portion 31 deteriorates. Because the deterioration in the function of the organic semiconductor circuit portion 31 progresses, the reproduction of the recorded data becomes impossible after a predetermined time period.

Figure 10C:
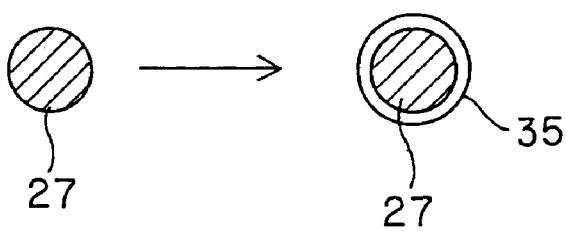

Incidentally, as shown in FIG. 10C, if the performance deterioration material 27 tends to activate without any treatment, this material 27 may be encapsulated into a microcapsule 35, which may be destroyed on the use. The introduction of the microcapsule 35 will be explained in detail below.

Here, a "time material" (corresponds to the performance deterioration material herein) and the activation of the time material will be explained. In the semiconductor memory element of the present invention, the time material is preliminarily mixed in a cell constructing the organic semiconductor, and this time material is activated by releasing a predetermined trigger, so that the organic semiconductor is deteriorated due to the activated species in order to intentionally obtain the limited lifetime. The trigger may be sensing pressure, heat, light or the like.

Incidentally, some time materials tend to start the deterioration without the special treatment if they are mixed in the organic semiconductor. Other time materials do not act on the organic semiconductor until the trigger is released.

An example of the former type (time materials tending to start the deterioration without the special treatment) is benzoyl peroxides or a so-called photopolymerization initiator having ketone group or azo group, from which radicals are caused by UV radiation, encapsulated in microcapsules made of gelatins, formaldehyde resins or polyurethane resins. The encapsulated chemicals exit from the microcapsules by means of the trigger and activated by UV radiation. The moisture may be encapsulated in the microcapsules so that the organic semiconductor is deteriorated by the moisture emitted from the microcapsules. Azo compounds may be encapsulated in the microcapsules so that azo compounds dissolve by heating and cause generation of nitrogen or nitrogen oxides in a form of gas and thereby physically cause cracks in the organic semiconductor layer for the deterioration thereof.

On the other hand, an example of the latter type (time materials not acting until the trigger is released) is a so-called cyanine dye such as cyanines, isocyanines or pseudocyanines having a heterocycle such as quinolines, thiazoles, pyridines, benzooxazoles or benzothiazoles. These chemicals are stable unless light of the absorption wavelength is irradiated, and their molecular chains are cut by the irradiation with light of the absorption wavelength and thereby radicals are produced. These radicals deteriorate the organic semiconductor.

As explained above, the performance deterioration material may be used as it is or may be used as encapsulated in the microcapsule, depending on the type of the performance deterioration material. Incidentally, also in the following examples, the aforementioned treatment depending on the type of the performance deterioration material is employed as well.

FIFTH EXAMPLE OF SEMICONDUCTOR MEMORY ELEMENT ACCORDING TO THE PRESENT INVENTION

Figure 11A:
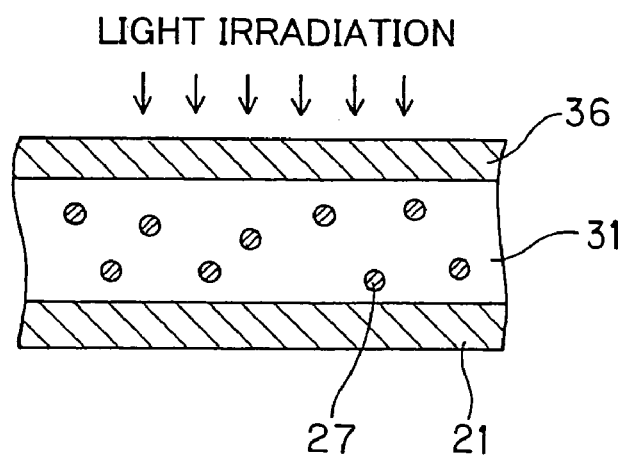
FIG. 11(A) and FIG. 11.(B) are views illustrating the fifth example of the semiconductor memory element according to the present invention.
Figure 11B:
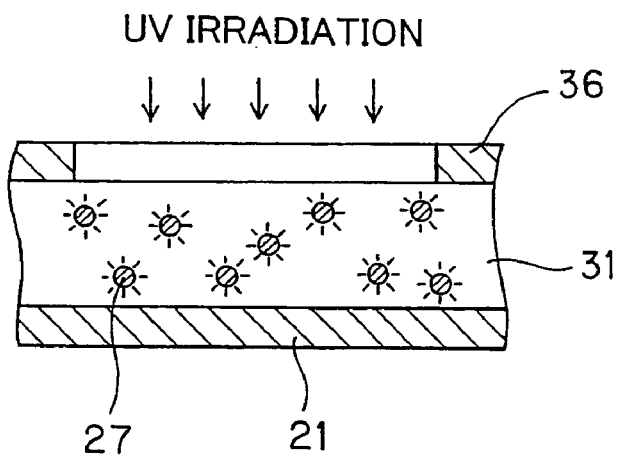

In this example, as shown in FIG. 11, the organic semiconductor circuit portion 31 and a color film layer 36 adjacent to the circuit portion 31 are disposed on the substrate 21. Furthermore, the performance deterioration material 27 is dispersed in the organic semiconductor circuit portion 31. The light of a predetermined wavelength is irradiated onto the color film layer 36 from the top so that the irradiated portion of the color film layer 36 obtains the light transmissive property in a wide range. Next, as shown in FIG. 11B, UV rays is irradiated to activate the performance deterioration material 27 so that the function of the organic semiconductor circuit portion 31 deteriorates. Because the deterioration in the function of the organic semiconductor circuit portion 31 progresses, the data reproduction becomes impossible after a predetermined time period.

SIXTH EXAMPLE OF SEMICONDUCTOR MEMORY ELEMENT ACCORDING TO THE PRESENT INVENTION

Figure 12A:
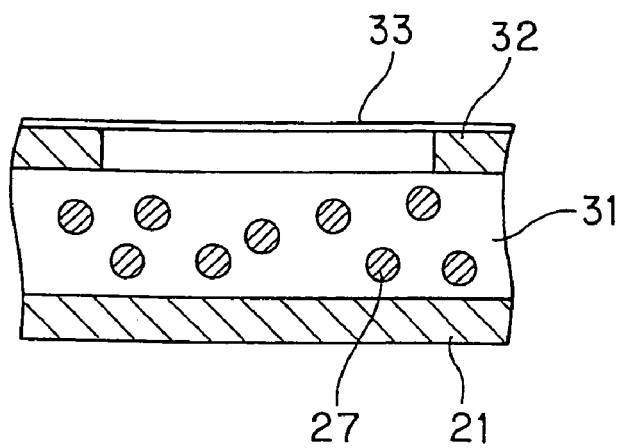
FIG. 12(A) and FIG. 12.(B) are views illustrating the sixth example of the semiconductor memory element according to the present invention.
Figure 12B:
Figure 12B:
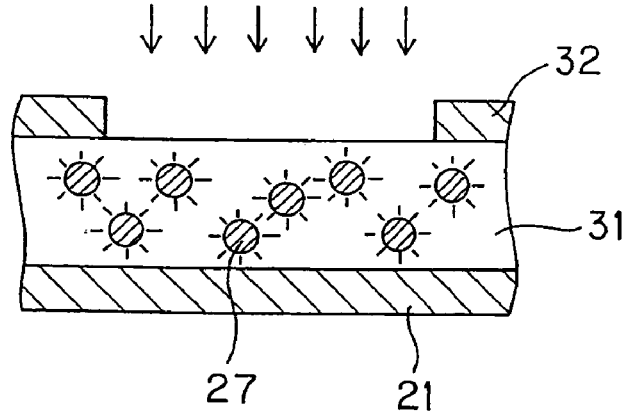

In this example, as shown in FIG. 12A, the organic semiconductor circuit portion 31 and the protection film 32 adjacent to the circuit portion 31 are disposed on the substrate 21. Furthermore, the performance deterioration material 27 is dispersed in the organic semiconductor circuit portion 31. The protection film 32 has the opening portion at a position corresponding to a predetermined portion of the organic semiconductor circuit portion 31. The opening portion is sealed with the seal 33. Next, as shown in FIG. 12B, after stripping off the seal 33, UV rays is irradiated to activate the performance deterioration material 27 and thereby deteriorate the function of the organic semiconductor circuit 31. Because the deterioration in the function of the organic semiconductor circuit portion 31 progresses, the data reproduction becomes impossible after a predetermined time period. Incidentally, the opening portion may be fullfilled by a transparent material.

EXAMPLE OF CARD-LIKE SEMICONDUCTOR MEMORY ELEMENT ACCORDING TO THE PRESENT INVENTION

Next, with reference to FIG. 13 to FIG. 15, examples of the card-like semiconductor memory according to the present invention will be explained. The organic semiconductor can be fabricated by using the printing technology, which makes it possible to fabricate a relatively large size memory such as a card-like memory at a low cost.

Figure 13:
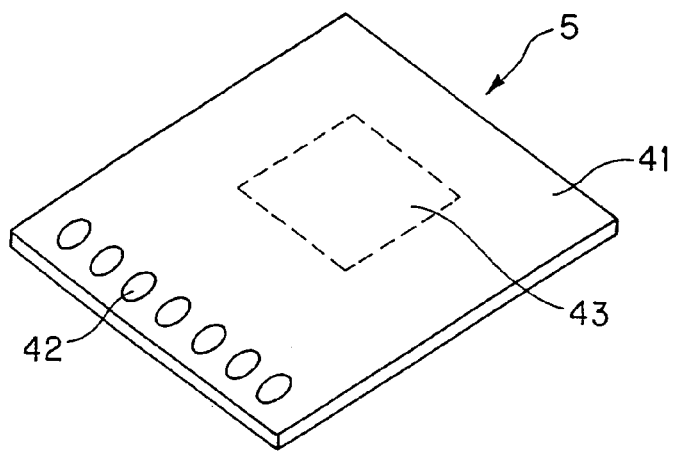
FIG. 13 is a view illustrating the first example of a card like semiconductor memory element of the present invention.

In a memory card 5, as shown in FIG. 13, a semiconductor chip 43 is enclosed in a card-like package 41, at one edge of which electrodes 42 are formed to electrically contact with an external device. The bonding pads 18 of the memory 1 shown in FIG. 1 for example may be connected to electrodes 42, so that an electrical connection between the semiconductor chip 43 and the external device is established.

The semiconductor chip 43 used for the memory card 5 is the organic semiconductor in a form shown in FIGS. 7A-7B, or shown in FIGS. 10A-10C. In this case, the crack 32a is caused in the protection layer by heating or pressurizing or irradiation with light from the top of the semiconductor chip 43, so that the moisture or oxygen in the air diffuses in the semiconductor circuit portion 31 made of the organic semiconductor and thereby the deterioration in the organic semiconductor progress. The data reproduction is performable within the lifetime.

Figure 14:
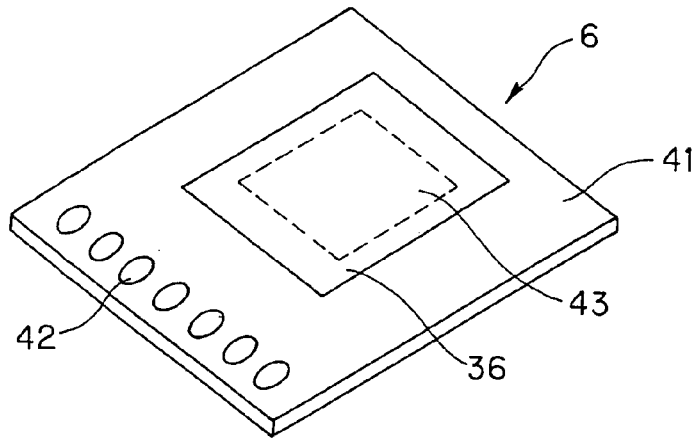
FIG. 14 is a view illustrating the second example of a card like semiconductor memory element of the present invention.

In a memory card 6, as shown in FIG. 14, the semiconductor chip 43 is enclosed in the card-like package 41, at one edge of which electrodes 42 are formed to contact with the external device. For example, the bonding pads 18 of the memory 1 shown in FIG. 1 are connected to the electrodes 42 to establish the electrical connection between the semiconductor chip 43 and the external device. The top portion of the semiconductor 43 is covered with the color film layer 36.

The semiconductor chip 43 used for the memory card 36 is the organic semiconductor in a form shown in FIGS. 11A-11B. In this case, the light of the predetermined wavelength is irradiated onto the color film layer 36, and then UV rays is irradiated to activate the performance deterioration material 27 dispersed in the semiconductor circuit portion 31, so that the deterioration in the organic semiconductor progresses and allows the record data reproduction within the lifetime.

Figure 15:
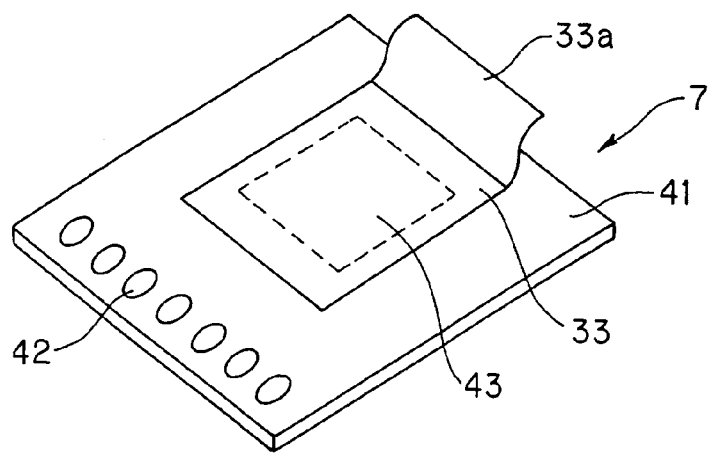
FIG. 15 is a view illustrating the third example of a card like semiconductor memory element of the present invention.

In a memory card 7, as shown in FIG. 15, the semiconductor chip 43 is enclosed in the card-like package 41, at one edge of which electrodes 42 are formed to contact with the external device. For example, the bonding pads 18 of the memory 1 shown in FIG. 1 may be connected to the electrodes 42 to establish the electrical connection between the semiconductor chip 43 and the external device. The semiconductor chip 43 has the opening portion at the top portion thereof, which is sealed with the seal 33. An ear portion 33a is formed at the tip of the seal 33 to facilitate the stripping.

The semiconductor chip 43 used for the memory card 7 is the organic semiconductor in a form shown in FIGS. 8A-8B, or shown in FIGS. 12A-12B. In the case of the organic semiconductor shown in FIGS. 8A-8B, if the seal 33 is stripped off, the moisture or oxygen in the air diffuses in the semiconductor circuit portion 31, so that the deterioration in the organic semiconductor progresses and the data reproduction is allowed within the lifetime.

On the other hand, in the case of the organic semiconductor shown in FIGS. 12A-12B, after the seal 33 is stripped off, UV rays is irradiated to activate the performance deterioration material 27 dispersed in the semiconductor circuit portion 31, so that the deterioration in the organic semiconductor progresses and the record data reproduction is allowed within the lifetime. In order to avoid the influence by the moisture or oxygen in the air, the opening portion may be covered with a light transmissive material. It is particularly effective in a form in which the deterioration speed and thereby the lifetime are controlled by UV irradiation amount.

Additionally, a card form can be off course made from the organic semiconductor shown in FIGS. 9A-9B. Also in this case, the crack 32a is caused in the protection film 32 by heating or pressurizing, or irradiation with light and so on, so that the performance deterioration material 27 in the performance deterioration material layer 29 diffuses in the semiconductor circuit portion 31 and thereby the deterioration in the organic semiconductor progresses, and the record data reproduction is allowed within the lifetime.

Lifetime Operation Starting Apparatus for Semiconductor Memory Element According to the Present Invention An example of the lifetime operation starting apparatus for the semiconductor memory element according to the present invention will be explained, with reference to FIG. 16. This example is a device for releasing the trigger to start the lifetime of the aforementioned memory card, and for recording and reproducing the data.

The lifetime operation starting apparatus 8 is used for the organic semiconductor optically causing the performance deterioration as shown in FIGS. 7A-7B, FIGS. 9A-9B, or FIGS. 11A-11B. It is provided with a handling portion 51; a light source 52; an electrode 53; a control portion 54; a light source drive portion 55; a data record and reproduction portion 56, as shown in FIG. 16.

The operation portion 51 is for inputting an operational command to the lifetime operation starting apparatus 8. The light source 52 is for irradiating the light onto the semiconductor chip 43 of the memory card 6 to diffuse the performance deterioration material 27 in the organic semiconductor portion or activate the performance deterioration material 27. The electrode 53 contacts with the electrode 42 of the memory card 6 to supply the electrical power, input or output the record/reproduction control signal or the data. The control portion 54 is for controlling the entire operation of the apparatus. The light source drive portion 55 is for turning on the light source 52 under a control of the control portion 54. Furthermore, the data record and reproduction portion 56 is for writing (recording) the data on to the memory card 6 or reading (reproducing) the data. Additionally, the multipurpose function for the apparatus, such as display function, is employed.

The deterioration of the memory card 6 is started by the irradiation with light from the light source 52, allowing the data reproduction within the lifetime. For example, in the rental business of music or video soft, the irradiation time of the light can be controlled depending on the rental fee when the data is recorded, so that the lifetime can be set.

Incidentally, it will be obvious to those skilled in the art that the invention is not limited to the aforementioned structure, and the seal strip structure is provided in the case of the memory card in a form sealed with the seal as shown in FIGS. 8A-8B or FIGS. 12A-12B, or the heating means or pressure means is provided in the case of the memory card in a form involving the heat or pressure application as shown in FIGS. 10A-10C.

As explained above, according to the semiconductor memory element and the lifetime operation starting apparatus therefor according to the present invention, the reproduction time of the recorded data, i.e. the start time of the reproducible lifetime can be freely set. Furthermore, the lifetime itself can be freely set. Furthermore, since the semiconductor memory element is made of the organic semiconductor, the semiconductor memory element suitable for the mass production at a low cost is presented.

The present invention is not limited to the aforementioned examples and can be modified as appropriate within a range not departing from the essence or spirit of the invention read from claims and the whole specification. The semiconductor memory element and the lifetime operation apparatus therefore involving such a modification are all encompassed within a scope of the invention.

INDUSTRIAL APPLICABILITY

The semiconductor memory element and the lifetime operation starting apparatus therefor according to the present invention are applicable to various memory elements and various record devices for recording at high density and reproducing a large amount of information including various contents information such as video information or audio information, various data information for computers, or control information, by means of the organic semiconductor available at a relatively low cost and suitable for downsizing in its scale or thickness.

We claim:

1. A lifetime operation starting apparatus having a starting device for starting an operation of a semiconductor memory element using an organic semiconductor, which has a seal attached to a position corresponding to a predetermined portion thereof, within a lifetime,
the starting device being a seal strip off device for stripping off the seal in order to deteriorate a performance of the organic semiconductor by bringing elements outside of the seal into contact with the organic semiconductor.

2. A lifetime operation starting apparatus having a starting device for starting an operation of a semiconductor memory element using an organic semiconductor, which is protected by a protection portion, within a lifetime, the starting device being at least one of:
a mechanical punch device for punching a microhole through the protection portion to cause a crack in the protection portion;
a heating device for heating the protection portion to cause the crack in the protection portion;
a pressurizing device for pressurizing the protection portion to cause the crack in the protection portion; and
a light irradiation device for irradiating the protection portion with light to cause the crack in the protection portion.

3. A lifetime operation starting apparatus having a starting device for starting an operation of a semiconductor memory element using an organic semiconductor, in which a performance deterioration material for deteriorating a performance of the organic semiconductor is dispersed, within a lifetime, the starting device being at least one of:
a UV irradiation device for irradiating the performance deterioration material in the organic semiconductor with UV to activate the performance deterioration material; and
an electron beam irradiation device for irradiating the performance deterioration material in the organic semiconductor with electron beam to activate the performance deterioration material.

* * * * *